United States Patent [19]

Schamber et al.

[11] Patent Number: 5,376,799
[45] Date of Patent: Dec. 27, 1994

[54] TURBO-PUMPED SCANNING ELECTRON MICROSCOPE

[75] Inventors: Frederick H. Schamber, Murrysville; Fred C. Schwerer, Export; Albert H. Beebe, Pittsburgh; Richard J. Lee, Murrysville, all of Pa.

[73] Assignee: RJ Lee Group, Inc., Monroeville, Pa.

[21] Appl. No.: 54,163

[22] Filed: Apr. 26, 1993

[51] Int. Cl.$^5$ .............................................. H01J 37/16
[52] U.S. Cl. ............................................... 250/441.11
[58] Field of Search ................. 250/310, 311, 442.11, 250/441.11

[56] References Cited

U.S. PATENT DOCUMENTS

| | | | |
|---|---|---|---|
| 2,266,218 | 12/1941 | Krause | 250/441.11 |
| 2,292,087 | 8/1942 | Ramo | 250/441.11 |
| 3,638,015 | 1/1972 | Browning | 250/311 |
| 3,696,246 | 10/1972 | Buchanan | 250/49.5 A |
| 3,969,039 | 7/1976 | Shoulders | 417/244 |
| 4,095,104 | 6/1978 | LePoole et al. | 250/311 |
| 4,823,006 | 4/1989 | Danilatos et al. | 250/310 |
| 5,061,850 | 10/1991 | Kelly et al. | 250/309 |
| 5,089,708 | 2/1992 | Asselbergs | 250/442.11 |
| 5,103,102 | 4/1992 | Economou et al. | 250/492.2 |
| 5,111,054 | 5/1992 | Slingerland | 250/441.11 |
| 5,254,856 | 10/1993 | Matsui et al. | 250/441.11 |

FOREIGN PATENT DOCUMENTS

| | | | |
|---|---|---|---|
| 54-124966 | 9/1979 | Japan | 250/441.11 |
| 57-42127 | 3/1982 | Japan | 250/441.11 |

Primary Examiner—Bruce C. Anderson
Attorney, Agent, or Firm—Webb Ziesenheim Bruening et al.

[57] ABSTRACT

A scanning electron microscope with an effective vacuum evacuation system and vacuum pump mounting system is disclosed. A manifold having a sufficiently large gas conductance is connected to a gun assembly and to a specimen chamber. A vacuum pump is connected to the manifold for evacuating the gun assembly, specimen chamber and a beam tube. The vacuum pump mounting includes a cylindrical sleeve extending between the vacuum pump and the scanning electron microscope housing with a pair of radial O-rings sealing between the cylindrical sleeve, housing and vacuum pump.

19 Claims, 4 Drawing Sheets

TURBO-PUMPED SCANNING ELECTRON MICROSCOPE

BACKGROUND OF THE INVENTION

1. Field of the Invention

The present invention relates to electron microscopes and, more specifically, relates to evacuation systems for scanning electron microscopes.

2. Prior Art

Electron microscopes, including scanning electron microscopes, require a relatively high vacuum in order to operate for a variety of reasons.

The electron beam sources used to produce the beam cannot operate properly unless maintained in a relatively high vacuum. Atmospheric gas molecules within the gun assembly will be ionized by the passage of the electron beam and the liberated electrons and ions will flow to the anode and cathode, respectively. This may result in current instabilities as well as potentially severe and damaging arcing. Even at low concentrations, the acceleration of ions into the cathode results in a shortened operational life for the gun assembly. Consequently, a relatively high vacuum is required within a gun assembly to protect the emitter.

The electron beam can be scattered by the presence of molecules within the beam path. Consequently, to maintain a highly focused beam, such scattering must be minimized by maintaining a relatively high vacuum within the beam tube.

The presence of volatile contaminants within the optical system needs to be avoided since these contaminants may be polymerized by the impingement of the beam. Polymerization of the contaminants can form a coating upon surfaces which may alter the optical properties of the electron microscope. Likewise, impingement of the beam upon the specimen may cause volatile organics to be polymerized and to form a coating on the specimen surface. This layer of contamination can quickly obscure small details. These additional possibilities require a clean vacuum to prevent system or sample contamination.

Vacuum systems for evacuating scanning electron microscopes have been used for a number of years. The most basic configuration of a scanning electron microscope vacuum system provides an oil diffusion pump mounted directly beneath the specimen chamber. The evacuation of the gun is accomplished via the beam tube. The arrangement is very simple but does not result in effective evacuation of the gun assembly due to the small channel (i.e., the beam tube) through which it must be evacuated.

An alternative arrangement was designed in which a small bypass tube is provided to connect the gun assembly to the specimen chamber. This arrangement offers some advantages over previous models but still is limited by the fact that all of the evacuation is being performed through the specimen chamber. Consequently, the vacuum which is obtainable in the gun assembly can be no better than that present in the specimen chamber. This can be particularly troublesome when dealing with specimens which "outgas".

A vacuum system for a scanning electron microscope was designed which somewhat decouples the evacuation of the gun cavity from that of the specimen chamber, as shown in FIG. 1. The vacuum pump 10 is connected to a manifold duct 12, or cavity, separate from the specimen chamber 14. The connections to the specimen chamber 14 and the gun assembly 16 proceed from the manifold duct 12. This arrangement is commonly used in more expensive scanning electron microscopes in one form or another. This arrangement still suffers from the disadvantage of having a bypass connecting pipe 18 of relatively small diameter extending between the manifold duct 12 and the gun assembly 16. This arrangement effectively limits the degree of vacuum which can be achieved in the gun assembly 16.

The oil diffusion pump has been commonly used as the means for evacuating a scanning electron microscope since it historically offered the highest pumping speed for the lowest price. The principle of operation of the oil diffusion pump is the entrapment of gas molecules in a supersonic jet of oil vapor. The disadvantage of oil diffusion pumps is that the disruption of the jet, such as through an inrush of air, will cause turbulence in the jet stream and the pumping oil will then be dispersed throughout the system being pumped. Consequently, other types of high vacuum pumps are increasingly being used in applications where oil contamination is unacceptable.

Scanning electron microscopes have increasingly been equipped with turbomolecular pumps known as turbo pumps. The turbo pump employs several stages of high-speed turbine blades. Gas molecules striking the spinning blades are given momentum which impels them further into the successive compression stages of the pump where they are ultimately removed. The principal advantage of the turbo pump is that it is intrinsically oil free. However, in order to use a turbo pump in a scanning electron microscope, it is necessary to deal with the high-frequency vibrations produced by such pumps. Though turbo pumps have become increasingly quiet, they still produce an unacceptable level of vibration by scanning electron microscope standards. Consequently, it is necessary to provide a system for mechanically decoupling the turbo pump from the optics of the scanning electron microscope. Traditionally, this has been done by suspending the pump 10 from a metal bellows 20, as shown in FIG. 2. An elastomer sleeve 22 surrounding the metal bellows 20 has also been utilized. The suspension by metal bellows 20 represents an expensive and cumbersome arrangement. The use of metal bellows suffers from several disadvantages. First, the use of metal bellows is an expensive isolation process. Second, the flexibility of the metal bellows limits the orientation of the pump being utilized. Third, the metal bellows have a large internal surface area with numerous small angles which can act to trap gases minimizing the effectiveness of the evacuation system. Additionally, unless the metal bellows are constrained in some fashion, the suspended turbo pump may move a considerable distance when the system is pumped or vented. The repeated flexing may result in metal fatigue and consequent failure of the metal bellows. Furthermore, metal-to-metal conductive paths through the bellows may transmit unwanted high-frequency vibrations.

Another isolation solution has been proposed using a "fat O-ring" 24 positioned so as to be axially compressed between the turbo pump 10 and the system to be isolated, shown in FIG. 3. The axial compression O-ring 24 is intended to act as a compliant isolator between the pump and the system. Implementation of the axial compression O-ring 24 requires an additional coupling device (not shown) to maintain tension across the axial compression O-ring 24 during nonuse. Without such additional coupling devices, the system would disassociate when not evacuated. Consequently, effective isolation must also be achieved through the additional coupling mechanism. The resulting isolation system represents a complex arrangement with no significant advantages over the metal bellows isolation system.

The object of the present invention is to provide a turbo-pumped scanning electron microscope which overcomes the aforementioned drawbacks of the prior art. Additionally, the object of the present invention is to provide a configuration for a vacuum system which results in an improved pumping of the vital gun area for scanning electron microscopes. A further object of the present invention is to provide an improved vibration isolation device which is compact, inexpensive, highly effective and which permits mounting of a turbo pump in a horizontal orientation substantially perpendicular to the beam tube.

SUMMARY OF THE INVENTION

The present invention provides a scanning electron microscope which includes a gun assembly, a beam tube connected to the gun assembly and a specimen chamber connected to the beam tube wherein the specimen chamber is adapted to receive a specimen therein. A manifold assembly is closely connected to the gun assembly and the specimen chamber. A vacuum generating device is connected to the manifold for evacuating the gun assembly, beam tube and specimen chamber.

Preferably, the manifold has a gas conductance which is substantially equal to or greater than the pumping speed of the vacuum generating device. This arrangement maximizes the effectiveness of the vacuum generating device. This relationship may be achieved by maintaining the length of the manifold at a minimum and having a cross-sectional area of the manifold substantially equal to or greater than the area of the inlet port of the vacuum generating device.

In a preferred embodiment of the present invention, the vacuum generating device is connected to the manifold at a position substantially midway between the gun assembly and the specimen chamber. Furthermore, the vacuum generating device comprises a turbo pump which is mounted substantially perpendicular to the manifold and the beam tube.

A baffle may be provided within the manifold for separating the manifold assembly into an upper portion extending between the gun assembly and the vacuum generating device and a lower portion extending between the specimen chamber and the vacuum generating device. The specimen chamber of the scanning electron microscope of the present invention may be removably connected to the beam tube and the manifold so as to allow easy access for arrangement and replacement of specimens within the specimen chamber. Multiple specimen chambers may also be provided. Additionally, an adjustable baffle or damper may be provided between the manifold and the specimen chamber. Furthermore, a first and second valve may be provided within the manifold to seal the manifold from the gun assembly and the specimen chamber, respectively. The provision of the removable specimen chamber, the adjustable baffle and the first and second valves within the manifold will increase the flexibility of the scanning electron microscope of the present invention.

The scanning electron microscope of the present invention may include a vibration isolation system for mounting the vacuum generating device to the manifold. The vibration isolation device includes a circular sleeve extending between the vacuum generating device and the manifold. A first radial O-ring provides a seal between the cylindrical sleeve and the manifold. A second radial O-ring provides a seal between the cylindrical sleeve and the vacuum generating device. The vibration isolation system may further include a plurality of compliant isolation mounts extending between the manifold and the vacuum generating device.

These and other advantages of the present invention will become apparent in the brief description of the preferred embodiment in connection with the attached figures in which like reference numerals represent like items throughout.

BRIEF DESCRIPTION OF THE PREFERRED EMBODIMENT

Figure 1:
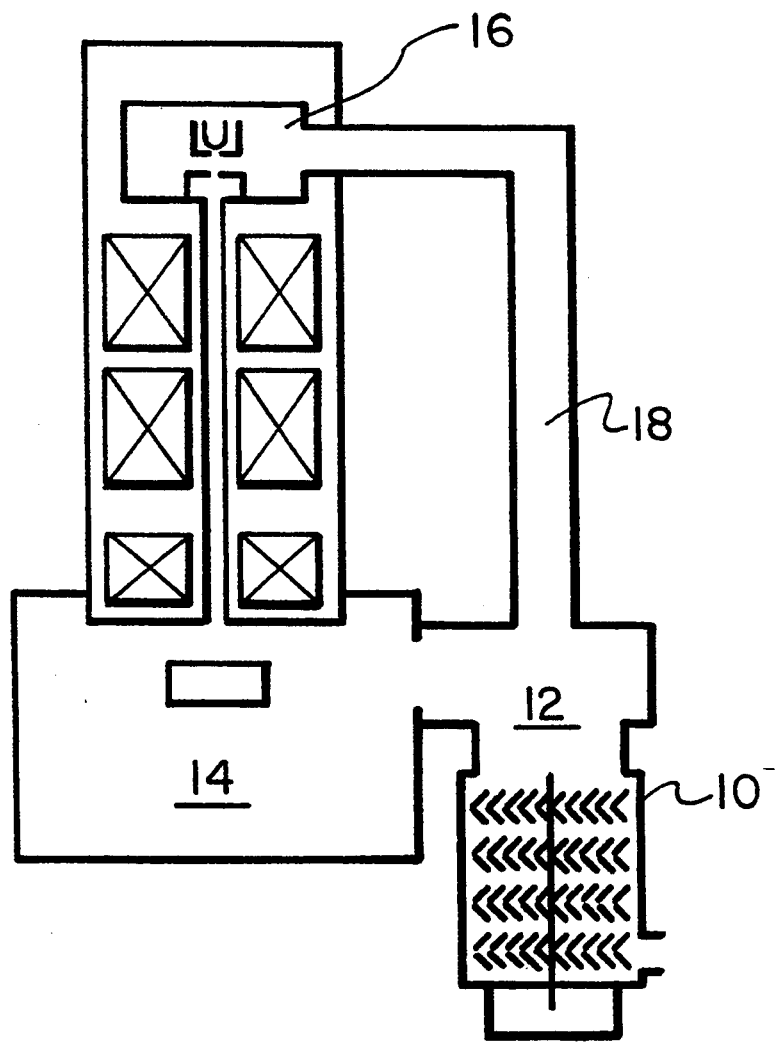
FIG. 1 schematically illustrates an evacuation system for a scanning electron microscope known in the prior art.
Figure 2:
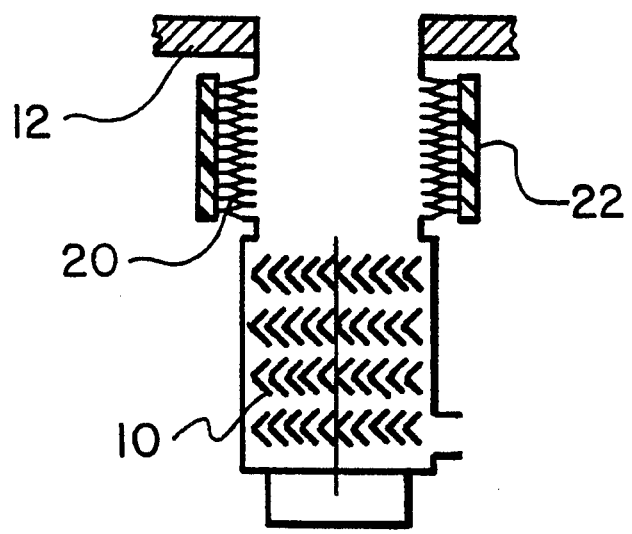
FIG. 2 schematically illustrates a vibration isolation system for mounting a vacuum pump to an electron microscope which is known in the prior art.
Figure 3:
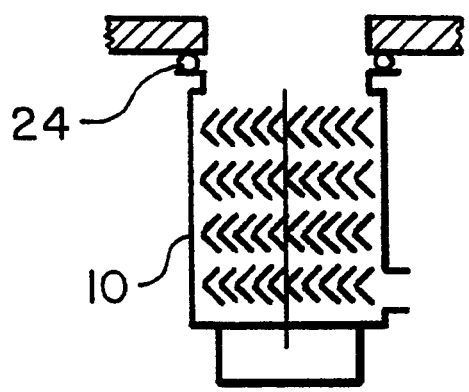
FIG. 3 schematically illustrates an alternative vibration isolation system for mounting a vacuum pump to an electron microscope which is known in the prior art.
Figure 4:
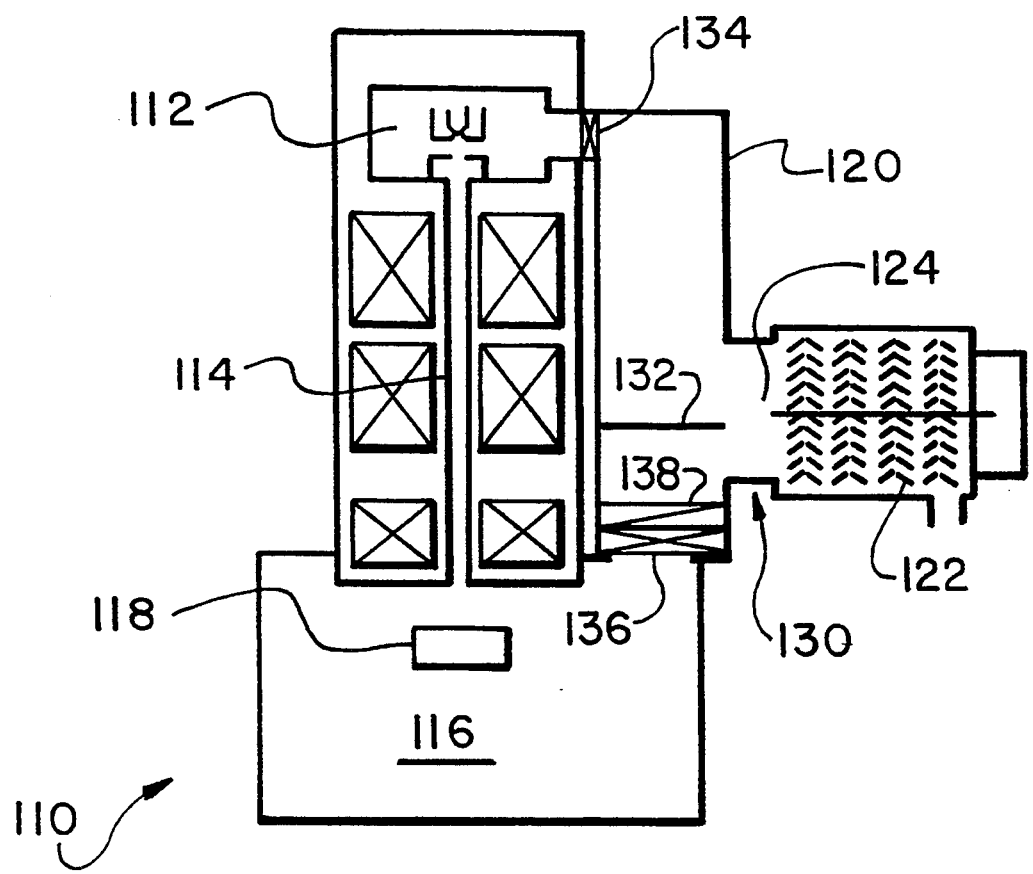
FIG. 4 schematically illustrates an evacuation system for a scanning electron microscope according to the present invention.

FIG. 4 schematically illustrates an evacuation system for scanning electron microscopes according to the present invention. The scanning electron microscope 110 includes a gun assembly 112 and a beam tube 114 connected to the gun assembly 112 directly below the gun assembly 112. A specimen chamber 116 is connected to the beam tube 114 with the specimen chamber 116 adapted to receive a specimen 118 therein to align with the beam tube 114.

A manifold assembly 120 whose central passage is of a relatively large cross-sectional area is connected to the gun assembly 112 and the specimen chamber 116. The concept of conductance has been developed as a mechanism for quantifying the ability of a tube or orifice to transmit gas molecules. Gas conductance is analogous to electrical conductance (i.e., the inverse of resistance). A large gas conductance value means that gas is evacuated readily through the system element. Assuming that a vacuum pump of a pumping speed $S_p$ is connected to a chamber to be evacuated by means of a conduit of conductance C, then the effective pumping speed S for the system is given by:

$$1/S = (1/C) + (1/S_p)$$

Consequently, if the conductance of the connecting conduit is sufficiently large, it has a negligible effect on the total pumping speed whereas if the gas conductance of the conduit is appreciably smaller than the pumping speed, the pumping speed of the system will be substantially limited by the conductance of the conduit. It is preferable that the conductance of the attaching conduit should at least be comparable to the pumping speed, or the capacity of the vacuum pump will be wasted.

The conductance of a cylindrical tube of diameter D and length L is known to be proportional to $D^3/L$ in the vacuum pressure regime which relates to the environments for scanning electron microscopes. Consequently, it is desirable to keep the evacuating tube length short. However, far more important is that the diameter of the conduit tube be sufficiently large since the diameter is the dominant element in determining the resulting conductance.

The scanning electron microscope 110 includes a turbo pump 122 connected to the manifold assembly 120 at a position substantially midway between the gun assembly 112 and the specimen chamber 116, possibly halfway. This placement minimizes the length of the manifold assembly 120 extending between the turbo pump 122 and the gun assembly 112 and between the turbo pump 122 and the specimen chamber 116. The turbo pump 122 has an inlet port 124 and is preferably mounted substantially perpendicular to the manifold assembly 120 and beam tube 114. The turbo pump 122 is connected to the manifold assembly 120 through a vibration isolation system 130 which will be described hereinafter. However, other vacuum pumps may be used with the design of the present invention and the vibration isolation system 130 may be eliminated where the vibration of the specific vacuum pump is not a concern.

The manifold assembly 120 is designed to have a gas conductance which is substantially equal to or greater than the pumping speed of the turbo pump 122 to maximize the effectiveness of the turbo pump 122. This relationship may be achieved by minimizing the effective length of the manifold assembly 120 as described above. Additionally, the cross-sectional area of the manifold should be substantially equal to or greater than the area of the inlet port 124 of the turbo pump 122. The area of the inlet port 124 of the turbo pump 122 is directly related to the pumping speed of the turbo pump 122. It is anticipated that the minimum cross-sectional area of the manifold assembly 120 (taken perpendicular to the beam tube 114) should be at least 75% of the area of the inlet port 124.

A baffle 132 may be provided in the manifold assembly 120 for separating the manifold assembly 120 into an upper portion extending between the turbo pump 122 and the gun assembly 112 and a lower portion extending between the turbo pump 122 and the specimen chamber 116. The incorporation of the baffle 132 effectively converts the manifold assembly 120 into two separate high-conductance conduits which feed directly to the turbo pump 122 and which communicate minimally with each other. This configuration is particularly desirable for dealing with specimens 118 which outgas heavily.

Additional valves may be provided within the scanning electron microscope 110 to permit isolation of various portions. For example, a first valve 134 may be provided within the manifold assembly 120 which is adapted to seal the manifold assembly 120 from the gun assembly 112. Additionally, a second valve 136 may be provided within the manifold assembly 120 to seal the manifold assembly 120 from the specimen chamber 116. The first valve 134 and second valve 136 can be selectively used. An adjustable baffle 138, or damper, may be provided within the manifold assembly 120 to limit the conductance to the specimen chamber 116. The limiting of the conductance to the specimen chamber 116 by the adjustable baffle 138 may be used to permit a relatively poor vacuum to be maintained in the specimen chamber 116 without appreciably affecting the vacuum within the gun assembly 112. This arrangement may be useful for evaluation of volatile specimens 118.

The specimen chamber 116 may be removably connected to the beam tube 114 and the manifold assembly 120 to allow for easy replacement. The removability of the specimen chamber 116 can reduce the setup time required for studying new specimens 118.

Figure 5:
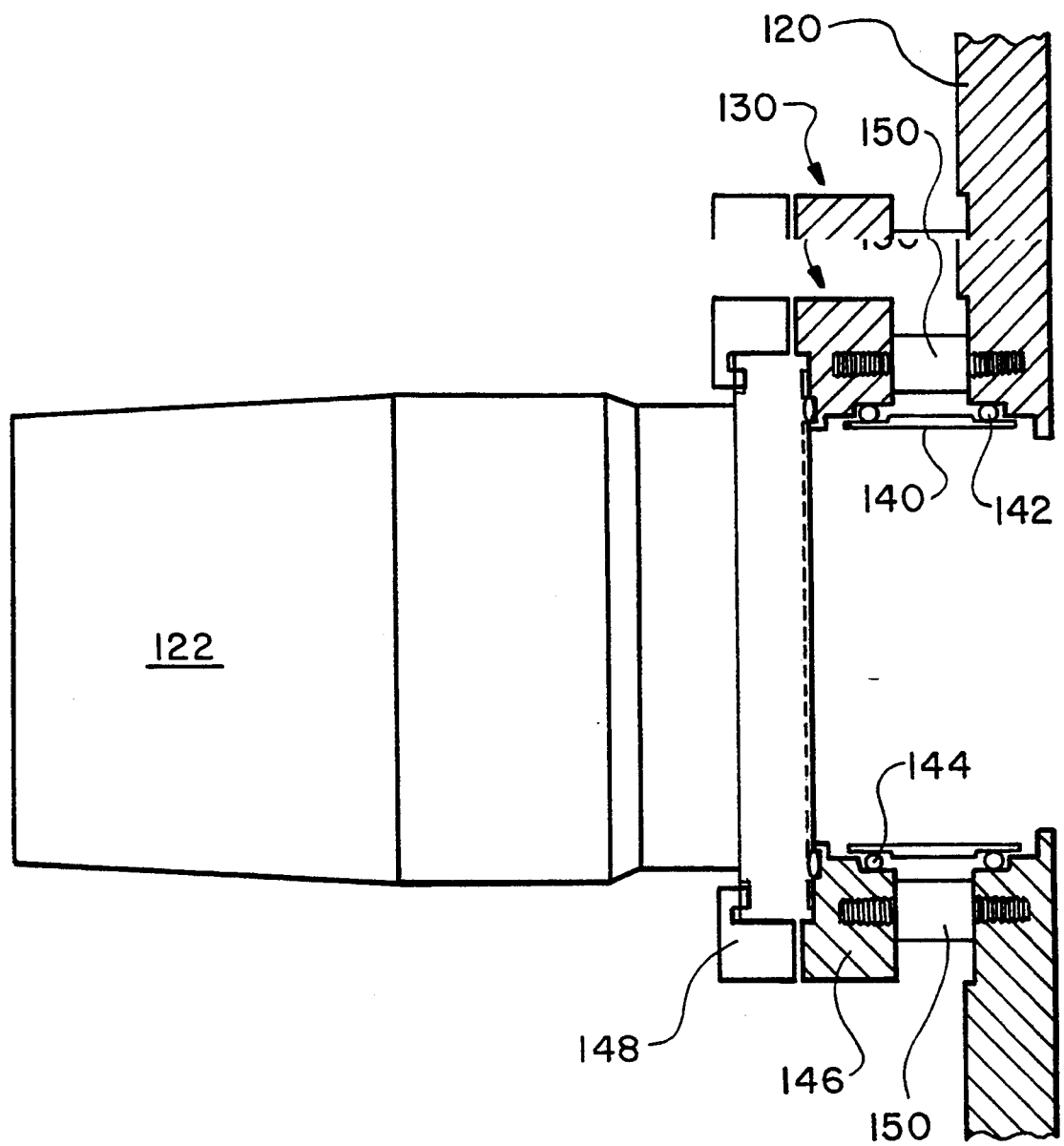
FIG. 5 illustrates a vibration isolation system according to the present invention.

The vibration isolation system 130 for isolating the turbo pump 122 from the manifold assembly 120 is shown in greater detail in FIG. 5. The vibration isolation system 130 includes a cylindrical sleeve 140 extending between the turbo pump 122 and the manifold assembly 120. A first radial O-ring 142 provides a seal between the cylindrical sleeve 140 and the manifold assembly 120. A second radial O-ring 144 provides a seal between the cylindrical sleeve 140 and a flange 146 which is sealed to the turbo pump 122. The flange 146 is attached to the turbo pump 122 through a clamping ring 148 and may be considered as part of the turbo pump 122.

A plurality of compliant isolation mounts 150 may be provided between the flange 146 and the manifold assembly 120. The compliant isolation mounts 150 are known in the art and consist of elastomeric cylinders with screw studs bonded to either end. The compliant isolation mounts 150 are designed to be compliant and damping in both the compressional and shear modes. When the scanning electron microscope 110 of the present invention is evacuated, the compliant isolation mounts 150 are under a heavy compressional load due to external atmospheric pressure and, when vented, the compliant isolation mounts 150 must support the weight of the turbo pump 122 in a combined shear and tension load. The compact turbo pump 122 used in the present invention weighs approximately eight pounds and is readily supported with negligible droop.

The vibration isolation system 130 provides the advantage that the radial O-rings 142 and 144 are not subject to compressional forces due to evacuation of the system. The compliance of the system is also aided by the ability of the radial O-rings 142 and 144 to roll slightly under lateral forces. The advantage of supporting the cylindrical sleeve 140 between the pair of radial O-rings 142 and 144 is that excellent compliance for small amplitude motions is maintained. Vibrational motion in the axial and radial directions and pivoting about any axis perpendicular to the centerline is accommodated by a pivoting motion of the sleeve 140 accompanied by appropriate rolling action of the radial O-rings 142 and 144. The radial O-rings 142 and 144 prohibit direct contact between the sleeve 140 and the manifold assembly 120 or the turbo pump 122.

From the foregoing, it will be apparent that the scanning electron microscope of the present invention has a number of advantages, some of which have been described above and others of which are inherent in the invention. It will also be apparent from the foregoing that modification may be made to the disclosed device without departing from the spirit and scope of the present invention. Accordingly, the scope of the invention is only to be limited as necessitated by the accompanying claims.

What is claimed is:

1. A scanning electron microscope comprising:
   a gun assembly;
   a beam tube connected to said gun assembly;

a specimen chamber connected to said beam tube, wherein said specimen chamber receives a specimen therein;

a manifold connected to said gun assembly and said specimen chamber; and a vacuum generating means connected to said manifold through an inlet port of said vacuum generating means for evacuating said gun assembly, said beam tube and said specimen chamber, wherein the minimum cross-sectional area of said manifold is substantially equal to or greater than the area of said inlet port of said vacuum generating means.

2. The scanning electron microscope of claim 1 wherein said vacuum generating means is connected to said manifold at a position substantially midway between said gun assembly and said specimen chamber.

3. The scanning electron microscope of claim 1 wherein said vacuum generating means includes a turbo pump mounted substantially perpendicular to the manifold and said beam tube.

4. The scanning electron microscope of claim 3 wherein said vacuum generating means includes a vibration isolation system comprising a circular sleeve extending between said turbo pump and said manifold;

a first radial O-ring providing a seal between said sleeve and said manifold; and a second radial O-ring providing a seal between said sleeve and said turbo pump.

5. The scanning electron microscope of claim 1 further including a baffle means provided in said manifold for separating said manifold into an upper portion extending to said gun assembly and a lower portion extending to said specimen chamber.

6. The scanning electron microscope of claim 1 wherein said specimen chamber is removably connected to said beam tube and said manifold.

7. The scanning electron microscope of claim 1 further including at least one isolation valve means provided within said manifold.

8. The scanning electron microscope of claim 1 further including an adjustable baffle positioned within said manifold between said vacuum generating means and said specimen chamber.

9. A scanning electron microscope comprising:
a gun assembly;
a beam tube connected to said gun assembly;
a specimen chamber connected to said beam tube, wherein said specimen chamber receives a specimen therein;
a manifold connected to said gun assembly and connected to said specimen chamber;
a vacuum generating means connected to said manifold for evacuating said gun assembly, said beam tube and said specimen chamber, said vacuum generating means mounted substantially perpendicular to said manifold and said beam tube; and
a baffle means provided in said manifold for separating said manifold into an upper portion extending to said gun assembly and a lower portion extending to said specimen chamber.

10. The scanning electron microscope of claim 9 wherein said vacuum generating means includes a vibration isolation system comprising:
a circular sleeve extending between said vacuum generating means and said manifold;
a first radial O-ring providing a seal between said sleeve and said manifold; and
a second radial O-ring providing a seal between said sleeve and said vacuum generating means.

11. The scanning electron microscope of claim 9 wherein said vacuum generating means is connected to said manifold at a position substantially midway between said gun assembly and said specimen chamber.

12. The scanning electron microscope of claim 9 wherein said specimen chamber is removably connected to said beam tube and said manifold.

13. The scanning electron microscope of claim 12 further including a plurality of compliant isolation mounts extending between said manifold and said turbo pump.

14. An electron microscope comprising:
an optical system including a gun assembly means for generating an electron beam, a beam tube connected to said gun assembly, a specimen chamber connected to said beam tube; and
a vacuum generating means for evacuating said gun assembly, said beam tube and said specimen chamber, said vacuum generating means including a vacuum generating source, and a vibration isolation system, wherein said vibration isolation system includes a cylindrical sleeve extending between said vacuum generating source and said optical system, a first radial O-ring providing a seal between said sleeve and said optical system, and a second radial O-ring providing a seal between said sleeve and said vacuum generating source.

15. The electron microscope of claim 14 wherein said vacuum generating source is a turbo pump mounted substantially perpendicular to said beam tube.

16. The electron microscope of claim 15 further including a plurality of compliant isolation mounts extending between said manifold and said turbo pump.

17. The electron microscope of claim 14 wherein said vacuum generating means is coupled to said optical system at a position substantially midway between said gun assembly means and said specimen chamber.

18. A scanning electron microscope comprising:
a gun assembly;
a beam tube connected to said gun assembly;
a specimen chamber connected to said beam tube, wherein said specimen chamber receives a specimen therein;
a manifold connected to said gun assembly and said specimen chamber; and
a vacuum generating pump connected to said manifold at a position substantially midway between said specimen chamber and said gun assembly for evacuating said gun assembly, said beam tube and said specimen chamber.

19. A scanning electron microscope comprising:
a gun assembly;
a beam tube connected to said gun assembly;
a specimen chamber connected to said beam tube, wherein said specimen chamber receives a specimen therein;
a manifold connected to said gun assembly and said specimen chamber; and
a vacuum generating means connected to said manifold for evacuating said gun assembly, said beam tube and said specimen chamber, said vacuum generating means having a pumping speed wherein said manifold has a gas conductance approximately equal to or greater than said pumping speed of said vacuum generating means.

* * * * *